(12) United States Patent
Okabe

(10) Patent No.: US 8,110,423 B2
(45) Date of Patent: Feb. 7, 2012

(54) METHOD OF MANUFACTURING SEMICONDUCTOR LIGHT-EMITTING DEVICE

(75) Inventor: Takehiko Okabe, Chiba (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 12/970,560

(22) Filed: Dec. 16, 2010

(65) Prior Publication Data

US 2011/0275172 A1 Nov. 10, 2011

(30) Foreign Application Priority Data

Dec. 18, 2009 (JP) ................. P2009-287900

(51) Int. Cl.
  *H01L 21/00* (2006.01)
  *H01L 21/301* (2006.01)
(52) U.S. Cl. .......... 438/33; 438/113; 438/460; 438/462; 257/E21.214
(58) Field of Classification Search .................... 438/33, 438/113, 460, 462; 257/E21.214
See application file for complete search history.

(56) References Cited

U.S. PATENT DOCUMENTS

| 7,572,657 B2 * | 8/2009 | Yakushiji | 438/33 |
| 7,700,413 B2 * | 4/2010 | Kusunoki | 438/114 |
| 7,772,605 B2 * | 8/2010 | Kusunoki | 257/98 |

FOREIGN PATENT DOCUMENTS

JP 2004-186340 A 7/2004

* cited by examiner

*Primary Examiner* — Hsien Ming Lee
(74) *Attorney, Agent, or Firm* — Sughrue Mion, PLLC

(57) ABSTRACT

A method of manufacturing a semiconductor light-emitting device which includes the steps of forming a plurality of light-emitting device sections (40), having an approximately rectangular shape in plan view, on a substrate (10) in a matrix shape, forming a first dividing groove (61) between the long sides (41) of the light-emitting device sections (40) so that the long side (41) of the light-emitting device section (40) is along an easily cleaved plane of the substrate (10), forming a second dividing groove (62), having a larger width than the width of the first dividing groove (61), between short sides (42) of the light-emitting device sections (40), and dividing the substrate (10) along a first dividing groove (61) and a second dividing groove (62) to cut out the light-emitting device section (40).

8 Claims, 7 Drawing Sheets

METHOD OF MANUFACTURING SEMICONDUCTOR LIGHT-EMITTING DEVICE

CROSS REFERENCE TO RELATED APPLICATIONS

This application claims the benefit of Japanese Patent Application No. 2009-287900, filed in the Japanese Patent Office on Dec. 18, 2009, the content of which is incorporated herein by reference.

BACKGROUND OF THE INVENTION

1. Field of the Invention

The present invention relates to a method of manufacturing a semiconductor light-emitting device.

2. Description of the Related Art

Generally, after a plurality of light-emitting device sections are formed by laminating a semiconductor layer, made of GaN or the like, on the surface of a large-scale and thin substrate and then forming an electrode section, LED (Light-Emitting Diode) chips are manufactured by dividing the substrate for each light-emitting device section mentioned above using a scribing method.

In recent years, with the miniaturization and high performance of LED chips, an important issue has been raised regarding how many LED chips to cut out from one substrate without damaging the light-emitting device section of the LED chip in a scribing step.

A scribing method is a method in which scribing grooves are provided so as to divide the substrate for each light-emitting device section mentioned above using a laser or a blade, and then a cleaving blade is pressed along the scribing grooves, and the substrate is cleaved lengthwise and crosswise to cut it.

Patent Document 1 (Japanese Unexamined Patent Publication No. 2004-186340) discloses a method of cleaving a compound semiconductor wafer. Scribing grooves are formed so as to cross a first groove having a continuous line shape and a second groove having a dashed line shape, and cleaving is performed in the scribing grooves, so that damage, such as chipping and the like of the corners, is prevented.

Since a method of cleaving the substrate is adopted in the scribing method, the substrate can be divided, and thus chipping of the corners is reduced. However, a sapphire component commonly used as a substrate material of the LED chip is too rigid to be processed. Therefore, even when the scribing method is used, small cracks are generated, and thus chipping often occurs.

When an n-type semiconductor layer, an active layer, a p-type semiconductor layer and the like are exposed due to the occurrence of chipping or poor separation, there may be a case where leakage occurs in the LED chip. For this reason, it is preferable to divide the substrate, insofar as possible, so as not to generate chipping or poor separation.

FIG. 8 is a unit cell diagram illustrating a sapphire crystal. As shown in FIG. 8, the sapphire is a single crystal made of hexagonal aluminum oxide ($Al_2O_3$), and has crystal planes such as a c-plane (0001), a-plane (11-20), r-plane (1-102), and m-plane (1-100). In addition, the sapphire has a c-axis, a-axis, and m-axis, which are perpendicular to the crystal planes such as the c-plane (0001), a-plane (11-20), m-plane (1-100). Here, -1 means that a bar is added onto 1, and -2 means that a bar is added onto 2. The m-plane (1-100) parallel to the a-axis direction is an easily cleaved plane.

When the LED chip having a rectangular shape in plan view is formed by the scribing method using the sapphire substrate, for example, the scribing grooves are formed so that the long side of the LED chip is made to be parallel to the m-axis direction of the sapphire substrate, and the short side thereof is made to be parallel to the a-axis direction of the sapphire substrate.

When the LED chip having a rectangular shape in plan view is cut out from the sapphire substrate, first, the substrate is cleaved along the scribing groove parallel to the a-axis direction, which serves as the short side of the LED chip, and a plurality of bar-shaped substrates are formed. Next, the substrate is cleaved along the scribing groove parallel to the m-axis direction from the bar-shaped substrate, and the LED chip having a rectangular shape in plan view is manufactured.

On the short side of the LED chip, since the cleavage is performed along the plane (easily cleaved plane) parallel to the a-axis direction, a plurality of bar-shaped substrates can be formed without chipping or poor separation occurring. However, on the long side of the LED chip, since cleavage is not performed along the easily cleaved plane, there is a problem in that chipping or poor separation is generated.

SUMMARY OF THE INVENTION

The present invention is contrived in view of such circumstances, and an object thereof is to provide a method of manufacturing a semiconductor light-emitting device which is capable of preventing the occurrence of chipping at the time of dividing a sapphire substrate, and preventing the generation of leakage due to chipping.

In order to achieve the foregoing object, the invention adopts the following configurations.

(1) A first aspect of the present invention provides a method of manufacturing a semiconductor light-emitting device, including the steps of: forming a plurality of light-emitting device sections, having an approximately rectangular shape in plan view, on a substrate in a matrix shape; forming a first dividing groove between the long sides of the light-emitting device sections so that the long side of the light-emitting device section is along an easily cleaved plane of the substrate; forming a second dividing groove, having a larger width than the width of the first dividing groove, between the short sides of the light-emitting device sections; and dividing the substrate along the first dividing groove and the second dividing groove to cut out the light-emitting device section.

(2) A second aspect of the invention is the method of manufacturing a semiconductor light-emitting device according to the above (1), wherein the substrate is made of a sapphire.

(3) A third aspect of the invention is the method of manufacturing a semiconductor light-emitting device according to the above (1) or (2), wherein the first dividing groove is formed so as to be parallel to the a-axis of the sapphire.

(4) A fourth aspect of the invention is the method of manufacturing a semiconductor light-emitting device according to any one of the above (1) to (3), wherein the width of the second dividing groove is set to twice the width or greater of the first dividing groove.

(5) A fifth aspect of the invention is the method of manufacturing a semiconductor light-emitting device according to any one of the above (1) to (4), wherein the first dividing groove and the second dividing groove are formed by one means selected from the group consisting of a laser method, a scribing method, a dicing method, and a dry-etching method.

(6) A sixth aspect of the invention is the method of manufacturing a semiconductor light-emitting device according to any one of the above (1) to (5), wherein the substrate has an altered portion formed by laser irradiation from the front (top face) or the rear of the substrate so as to be along the central line of the first dividing groove and the central line of the second dividing groove.

(7) A seventh aspect of the invention is the method of manufacturing a semiconductor light-emitting device according to the above (6), wherein as the heights of the region of the altered portion formed by the laser irradiation, the height of the region of the altered portion formed to be along the central line of the first dividing groove and the height of the region of the altered portion formed to be along the central line of the second dividing groove are different from each other.

(8) An eighth aspect of the invention is the method of manufacturing a semiconductor light-emitting device according to the above (6), wherein as the height of the region of the altered portion formed by laser irradiation, the height of the region of the altered portion formed to be along the central line of the second dividing groove is larger than the height of the region of the altered portion formed to be along the central line of the first dividing groove.

According to the above-mentioned configurations, it is possible to provide a method of manufacturing a semiconductor light-emitting device which is capable of preventing the occurrence of chipping when divided from a sapphire substrate, and preventing leakage even when chipping occurs.

According to the method of manufacturing a semiconductor light-emitting device of the present invention, since the first dividing groove is formed between the long sides of the light-emitting device sections so that the long side of the light-emitting device section is along the easily cleaved plane of the substrate, it is possible to easily cleave the substrate by the first dividing groove, and to prevent the occurrence of chipping in the long side of the light-emitting device section. In addition, since the second dividing groove having a larger width than the width of the first dividing groove is formed between the short sides of the light-emitting device sections, even when chipping occurs at the time of cleaving the substrate by the second dividing groove, chipping does not reach the light-emitting device section, thereby allowing leakage in the light-emitting device section to be prevented.

BRIEF DESCRIPTION OF THE DRAWINGS

FIG. 1A is a schematic plan view, FIG. 1B is a side view, and FIG. 1C is an enlarged view of the A portion in FIG. 1B.

FIG. 3A is a plan view illustrating a wafer at the point in time where a first dividing groove and a second dividing groove are formed, FIG. 3B is an enlarged plan view illustrating a portion of the wafer shown in FIG. 3A, and FIG. 3C is a cross-sectional view taken along the D-D' line of FIG. 3B.

FIG. 4A is a plan view illustrating the wafer, and FIG. 4B is an enlarged plan view illustrating a portion of the wafer shown in FIG. 4A.

FIG. 5A is a cross-sectional view taken along the E-E' line of FIG. 4B, and FIG. 5B is a cross-sectional view taken along the F-F line of FIG. 4B.

DETAILED DESCRIPTION OF THE INVENTION

Hereinafter, embodiments for carrying out the invention will be described.

First Embodiment

An example of a method of manufacturing a semiconductor light-emitting device which is an embodiment of the invention will be described.

The method of manufacturing the semiconductor light-emitting device which is an embodiment of the invention includes the steps of forming a plurality of light-emitting device sections, having an approximately rectangular shape in a plan view, on a substrate in a matrix shape (first step), forming a first dividing groove between the long sides of the light-emitting device sections so that the long side of the light-emitting device section is along an easily cleaved plane of the substrate (second step), forming a second dividing groove, having a larger width than the width of the first dividing groove, between the short sides of the light-emitting device sections (third step), and dividing the substrate along the first dividing groove and the second dividing groove to cut out the light-emitting device section (fourth step).

Here, one light-emitting device, having an approximately rectangular shape in a plan view, which is applied to the method of manufacturing the semiconductor light-emitting device according to the invention has an arrangement of which the rectangular ratio (=length of the long side $n_2$/length of the short side $n_1$) exceeds 1, preferably the rectangular ratio is 1.2 to 3, and more preferably the rectangular ratio is 1.5 to 2.5.

(First Step)

Figure 1A:
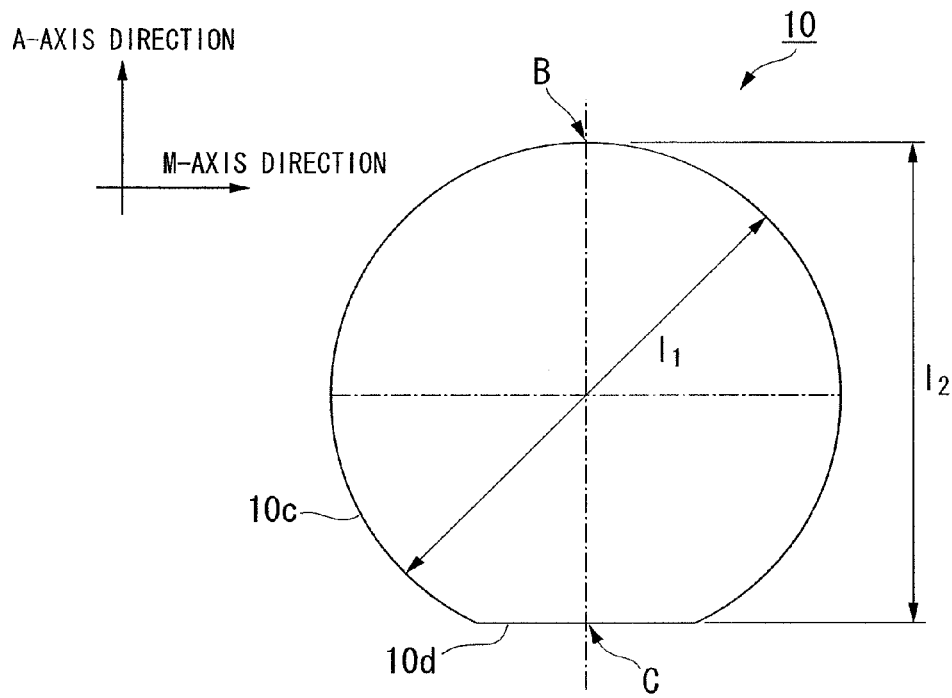
FIGS. 1A to 1C are diagrams illustrating an example of a substrate used in a method of manufacturing a semiconductor light-emitting device according to the invention.
Figure 1B:
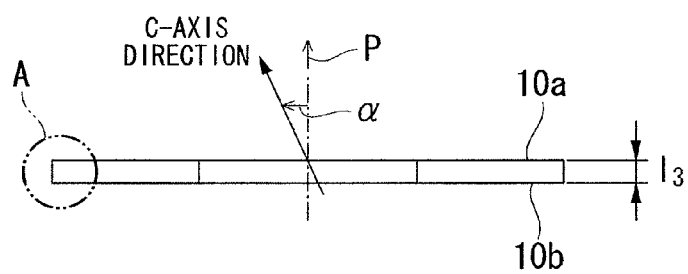
Figure 1C:
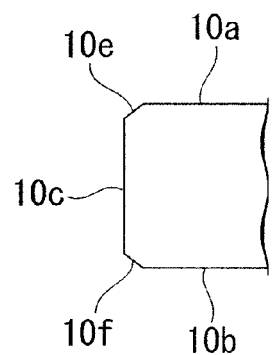

FIGS. 1A to 1C are schematic diagrams illustrating an example of the substrate used in the method of manufacturing the semiconductor light-emitting device which is an embodiment of the invention; FIG. 1A is a plan view, FIG. 1B is a side view, and FIG. 1C is an enlarged view of the A portion in FIG. 1B. Meanwhile, in each of the drawings used in the following description, the characteristic portions may be enlarged and shown, for convenience, in order to easily understand the characteristics thereof, and the dimensional ratios of each of the components and the like are not necessarily the same as the actual conditions.

As shown in FIGS. 1A and 1B, a substrate 10 is an approximately disk-shaped member. The substrate 10 is made of, for example, sapphire.

As shown in FIG. 1A, an orientation flat portion 10d in which a part of the outer circumference 10c of the substrate 10 is formed in a linear fashion is formed in the substrate 10 as a mark of crystal orientation. The orientation of the orientation flat portion 10d is substantially parallel to the m-axis direction, and is substantially perpendicular to the a-axis direction.

As shown in FIG. 1A, the outside diameter of the substrate 10 is set to $l_1$. In addition, the height of the orientation flat portion 10d is set to $l_2$. The height $l_2$ of the orientation flat portion 10d is a length between the point B at which the perpendicular line passing through the center of the substrate 10 (with respect to the orientation flat portion 10d) intersects the outer circumference 10c of the substrate 10, and the midpoint C of the orientation flat portion 10d.

As shown in FIG. 1B, the thickness of the substrate 10 is set to $l_3$. The c-axis direction of the substrate 10 is a direction at an angle of a to the perpendicular line P of one plane (main plane) 10a of the substrate 10.

As shown in FIG. 1C, one plane 10a side and the other surface 10b side of the outer circumference 10c of the substrate 10 are respectively truncated, and inclined planes 10e and 10f are formed thereon. Meanwhile, the orientation flat portion 10d of the substrate 10 is also truncated in the same manner.

Figure 2:
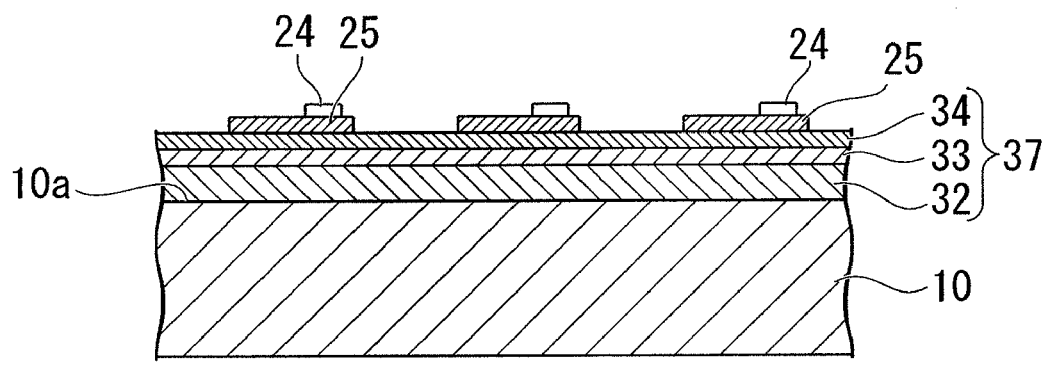
FIG. 2 is a diagram illustrating an example explaining one step of the method of manufacturing the semiconductor light-emitting device according to the invention, and a schematic cross-sectional view at the point in time where a positive-electrode bonding pad is formed.

FIG. 2 is a diagram explaining one step of the method of manufacturing the semiconductor light-emitting device which is an embodiment of the invention, and is a schematic cross-sectional view at the point in time where a positive-electrode bonding pad 24 is formed.

First, as shown in FIG. 2, an epitaxial layer 37 made of a group-III nitride semiconductor is formed on one plane 10a of the substrate 10.

Substrates having a sapphire single crystal, a SiC single crystal and the like can be used as the substrate 1. When a sapphire substrate is used as the substrate 1, it is preferable to set the (0001) C-plane to a main plane (surface). The plane orientation of the substrate 10 may be given an off angle of 0° with respect to the crystal plane, or may be imparted with an off angle.

When the epitaxial layer 37 is formed on the substrate 10, it is preferable to use a substrate having a thickness of 250 to 1000 μm as the substrate 10. When the thickness of the substrate 10 is less than 250 μm, there is a disadvantage where the substrate 10 is warped during the growth of the epitaxial layer. Moreover, in the substrate 10 having a thickness exceeding 1000 μm, it takes some effort to reduce the thickness of the substrate 10 through polishing after the growth of the epitaxial layer 37.

When the epitaxial layer 37 is formed on the substrate 10, it is preferable to form the epitaxial layer 37 on the substrate 10 with a buffer layer (not shown) and an underlying layer (not shown) formed on the buffer layer interposed therebetween.

The buffer layer is made of an aggregate having a column crystal with a group-III nitride semiconductor, and is provided for protecting the substrate 10 from a chemical reaction at high temperatures and lessening the difference of a lattice constant between the substrate 10 and the epitaxial layer 37. In addition, the underlying layer is made of a group-III nitride semiconductor, and the material of the underlying layer may be the same as that of the buffer and may not be the same. Further, although the underlying layer may be doped with n-type impurities such as Si, Ge and Sn as necessary, the underlying layer may be undoped. Undoping thereof is preferable from the viewpoint of maintaining the good crystalline property.

As shown in FIG. 2, the epitaxial layer 37 includes an n-type layer 32 having an n-type contact layer for forming an n-type electrode, a light-emitting layer 33 serving as a light-emitting section, and a p-type layer 34 having a p-type contact layer for forming a p-type electrode.

The n-type layer 32 is generally composed of an n contact layer and an n cladding layer. The n contact layer can double as the n cladding layer.

The n contact layer is preferably composed of an $Al_xGa_{1-x}N$ layer ($0 \leq x < 1$, preferably $0 \leq x \leq 0.5$, more preferably $0 \leq x \leq 0.1$). In addition, the n contact layer is preferably doped with n-type impurities. The n-type impurities include, for example, Si, Ge and Sn the like, preferably Si and Ge.

It is preferable to provide the n cladding layer between the n contact layer and the light-emitting layer 33. The n cladding layer can be formed of AlGaN, GaN, GaInN and the like.

The light-emitting layer 33 laminated on the n-type layer 2 includes the light-emitting layer 33 having a single quantum well structure or a multiple quantum well structure and the like. A group-III nitride semiconductor layer made of $Ga_{1-y}In_yN$ ($0 < y < 0.4$) is generally used as a well layer having a quantum well structure. In addition, in the case of the light-emitting layer 33 having a multiple quantum well structure, the well layer is formed of the above-mentioned $Ga_{1-y}In_yN$, and a barrier layer is formed of $Al_zGa_{1-z}N$ ($0 \leq z < 0.3$) having a larger bandgap energy than the well layer. The well layer and the barrier layer may be or may not be doped with impurities depending on design.

The p-type layer 34 is generally composed of a p cladding layer and a p contact layer. The p contact layer may double as the p cladding layer.

The p cladding layer is made of a composition having a larger bandgap energy than that of the light-emitting layer 33, and is not particularly limited insofar as confinement of carriers to the light-emitting layer 33 is possible. The p cladding layer is preferably made of $Al_xGa_{1-x}N$ ($0 < x \leq 0.4$). When the p cladding layer is made of such AlGaN, it is preferable on the points of confinement of carriers to the light-emitting layer.

The p-type doping concentration of the p cladding layer is preferably $1 \times 10^{18}$ to $1 \times 10^{21}/cm^3$, and more preferably $1 \times 10^{19}$ to $1 \times 10^{20}/cm^3$.

The p contact layer is preferably made of $Al_xGa_{1-x}N$ ($0 \leq x \leq 0.4$).

When the Al composition is in the above-mentioned range, it is preferable from the viewpoint of maintenance of the good crystalline property and good ohmic contact with a p ohmic electrode. In addition, when the p contact layer contains a p-type impurity (dopant) at a concentration of $1 \times 10^{18}$ to $1 \times 10^{21}/cm^3$, preferably at a concentration of $5 \times 10^{19}$ to $5 \times 10^{20}/cm^3$, it is preferable from the viewpoint of maintenance of the good ohmic contact, prevention of crack generation, and maintenance of the good crystalline property. Although the p-type impurity is not particularly limited, for example, it preferably includes Mg.

In forming such an epitaxial layer 7 on the substrate 1, methods such as an MOCVD method (metalorganic chemical vapor deposition), an HYPE method (hydride vapor-phase epitaxial method), an MBE method (molecular beam epitaxial method), and a sputtering method can be used. A particularly preferable growth method includes an MOCVD method from the viewpoint of film thickness controllability and mass productivity.

When a group-III nitride semiconductor is grown by the MOCVD method, hydrogen ($H_2$) or nitrogen ($N_2$) is used as a carrier gas, trimethylgallium (TMG) or triethylgallium (TEG) is used as a Ga source which is a group-III raw material, triethylaluminum (TMA) or triethylaluminum (TEA) is used as an Al source, trimethylindium (TMI) or triethylindium (TEI) is used as an In source, and ammonia ($NH_3$), hydrazine ($N_2H_4$) or the like is used as a N source which is a group-V raw material. In addition, as a dopant, in an n-type, monosilane ($SiH_4$) or disilane ($Si_2H_6$) is used as a Si raw material, organogermanium is used as a Ge raw material, and in a p-type, bis(cyclopentadienyl)magnesium ($Cp_2Mg$) or bis (ethylcyclopentadienyl)magnesium (($EtCp)_2Mg$) is used as a Mg raw material.

After the epitaxial layer 37 is formed, as shown in FIG. 2, a light-transmitting positive electrode 25 is formed at a predetermined position on the p-type layer 34 of the epitaxial layer 37 using a photolithographic technique and a liftoff technique which are known.

At least one selected from ITO ($In_2O_3$—$SnO_2$), AZnO (ZnO—$Al_2O_3$), IZnO ($In_2O_3$—ZnO), and GZO (ZnO—$GeO_2$) is used as a material of the light-transmitting positive electrode 25. In addition, any of the structures, including conventionally known structures, can be used as the structure of the light-transmitting positive electrode 25 without any limitation.

Next, as shown in FIG. 2, the positive-electrode bonding pad 24 is formed at a predetermined position on the light-transmitting positive electrode 25 using a known photolithographic technique.

As the positive-electrode bonding pad 24, various types of structures in which Au, Al, Ni, Cu and the like are used are well-known, and these well-known materials and structures can be used without any limitation.

(Second Step and Third Step)

Figure 3A:
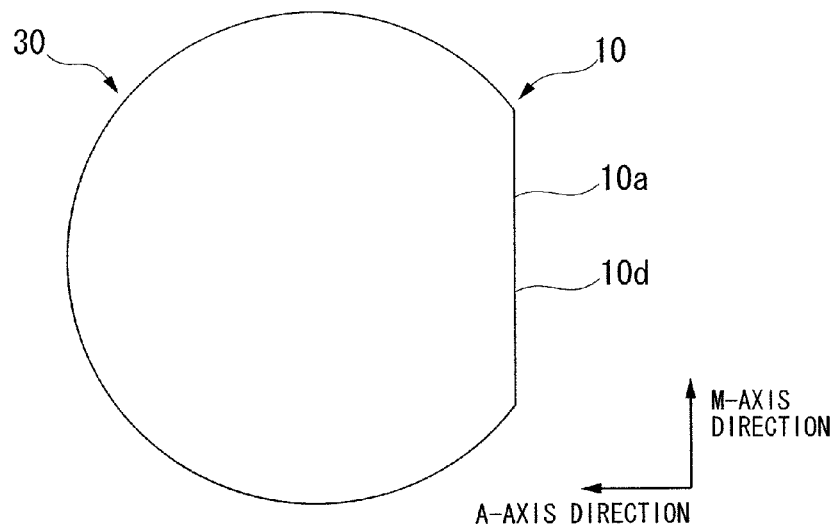
FIGS. 3A to 3C are diagrams illustrating an example explaining one step of the method of manufacturing the semiconductor light-emitting device according to the invention.
Figure 3B:
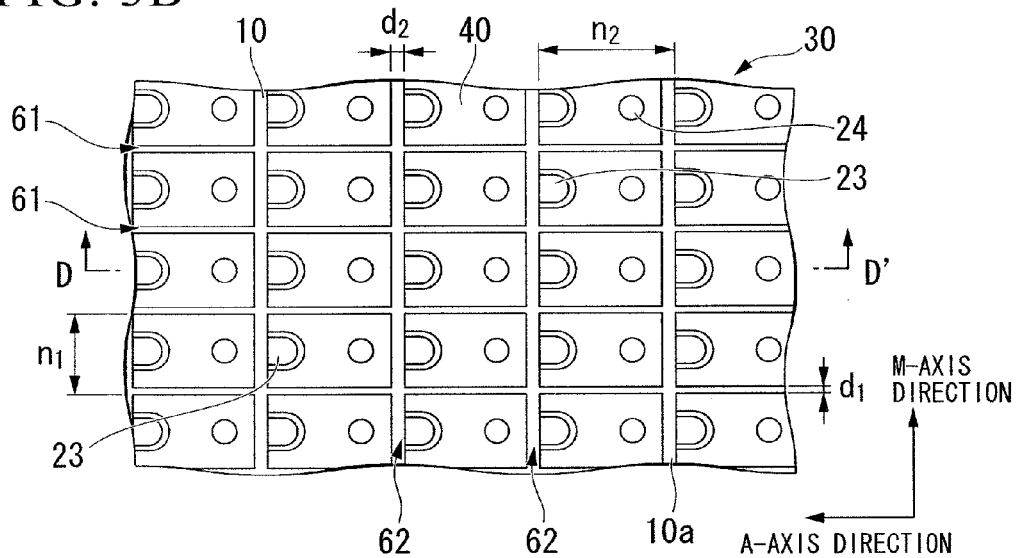
Figure 3C:
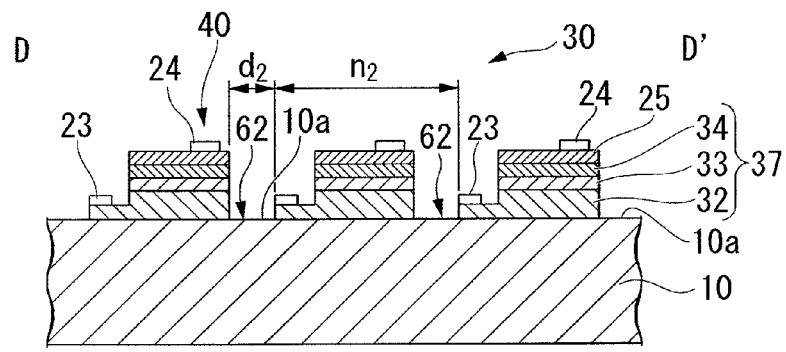

FIGS. 3A to 3C are diagrams explaining one step of the method of manufacturing the semiconductor light-emitting device which is an embodiment of the invention; FIG. 3A is a plan view illustrating the wafer at the point in time where the first dividing groove and the second dividing groove are formed, FIG. 3B is an enlarged plan view illustrating a portion of the wafer shown in FIG. 3A, and FIG. 3C is a cross-sectional view taken along the D-D' line of FIG. 3B. Meanwhile, in FIG. 3A, a light-emitting device section 40, a first dividing groove 61 and a second dividing groove 62 are omitted and shown in order to have an easy view of the drawing.

When the positive-electrode bonding pad 24 is formed, the epitaxial layer 37 is etched by a photolithographic technique and a reactive ion etching technique (simply referred to as the "etching method" in the specification) which are known, and then as shown in FIG. 3B, the first dividing groove 61 and the second dividing groove 62 are formed, and the n contact layer of the n-type layer 32 is exposed to a predetermined position facing the second dividing groove 62 in a semicircular shape.

Meanwhile, as means for forming the first dividing groove 61 and the second dividing groove 62, in addition to the above-mentioned etching method, well-known methods such as a laser method, a dicing method and a scribing method can be used without any limitation.

However, as means for forming the first dividing groove 61 and the second dividing groove 62, etching methods such as wet etching and dry etching can be preferably used.

For example, methods such as reactive ion etching, ion milling, focused beam etching and ECR etching can be used as dry etching, and a mixed acid of sulfuric acid and phosphoric acid, for example, can be used as wet etching. However, before etching is performed, a predetermined mask is formed on the surface of a gallium nitride-based compound semiconductor so as to have a desired chip shape.

In addition, when the first dividing groove 61 and the second dividing groove 62 are formed by the laser method, there may be a concern that contamination is scattered and attached to the lateral side of the laminated semiconductor layer, to thereby cause the electrical characteristics to be deteriorated. In order to prevent this, there is a method of forming a protective film such as a resist having an excellent heat resistance, and removing the protective film together with the contamination on the protective film through cleaning after the dividing grooves are formed.

In addition, although variation of the processing accuracy due to attrition and deterioration of a blade or a diamond stylus is of concern in the dicing method or the scribing method, it is possible to increase the processing accuracy by raising the exchange frequency of exchange of the blade edges and the like.

As shown in FIGS. 3B and 3C, the first dividing groove 61 is provided in the direction parallel to the a-axis direction, that is, in the direction perpendicular to the orientation flat plane 10d of the substrate 10. The width of the first dividing groove 61 is set to $d_1$. In addition, the second dividing groove 62 is provided in the direction parallel to the m-axis direction, that is, in the direction parallel to the orientation flat plane 10d of the substrate 10. The width of the second dividing groove 62 is set to $d_2$.

The first dividing groove 61 and the second dividing groove 62 are provided so as to intersect each other. Thereby, a plurality of light-emitting device sections 40 having an approximately rectangular shape in a plan view is partitioned in a matrix shape.

A plurality of light-emitting device sections 40 is provided at intervals of $n_2$ in the a-axis direction and at intervals of $n_1$ in the m-axis direction.

The first dividing groove 61 is preferably formed so as to be along the easily cleaved plane of the substrate 10.

In addition, the width $d_2$ of the second dividing groove 62 is preferably larger than the width $d_1$ of the first dividing groove 61. Specifically, the width $d_2$ of the second dividing groove 62 is more preferably set to twice the width $d_1$ or greater of the first dividing groove 61.

Next, as shown in FIGS. 3B and 3C, a negative-electrode bonding pad 23 is formed on the n contact layer of the exposed n-type layer 32.

As the negative-electrode bonding pad 23, various types of compositions or structures in which Ti, Au and the like are used are well-known. These well-known compositions or structures can be used without any limitation, and can be provided by commonly-used means which are widely known in the art.

(Fourth Step)

Figure 4A:
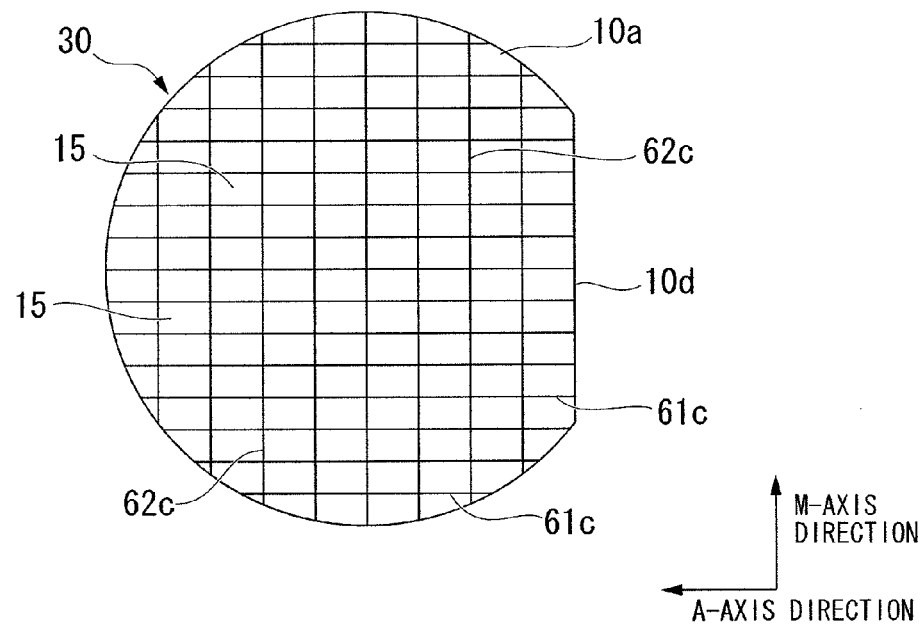
FIGS. 4A and 4B are diagrams illustrating an example explaining one step of the method of manufacturing the semiconductor light-emitting device according to the invention.
Figure 4B:
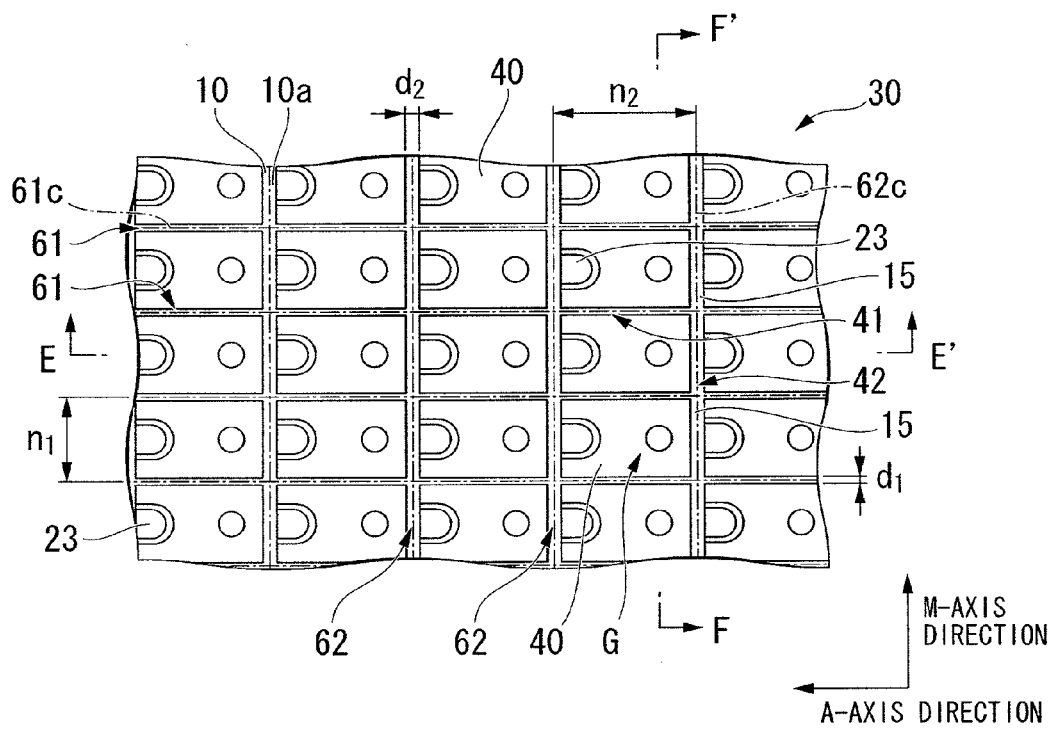
Figure 5A:
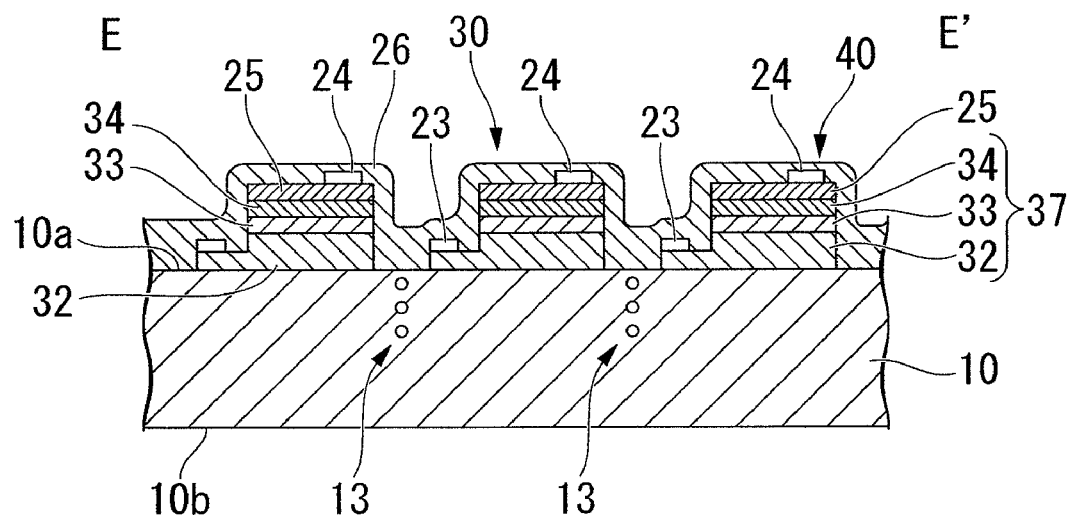
FIGS. 5A and 5B are diagrams illustrating an example explaining one step of the method of manufacturing the semiconductor light-emitting device according to the invention.
Figure 5B:
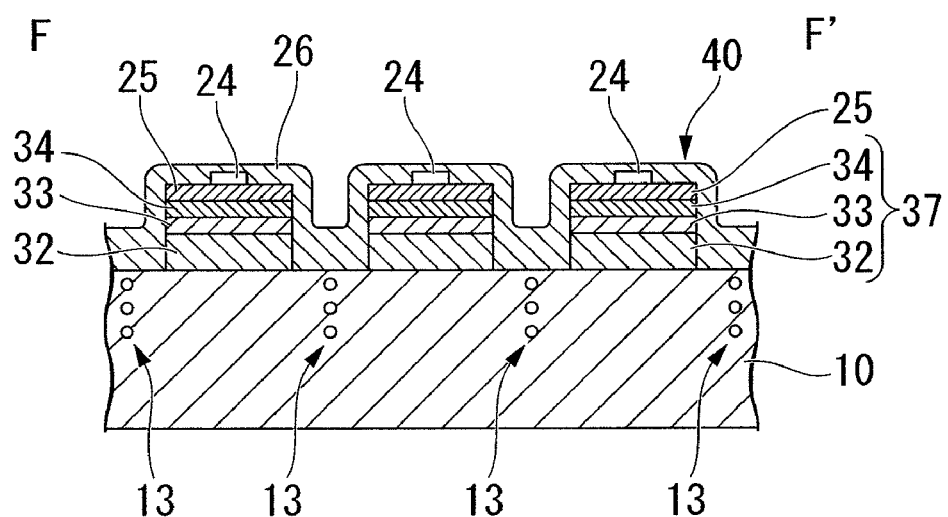
Figure 6:
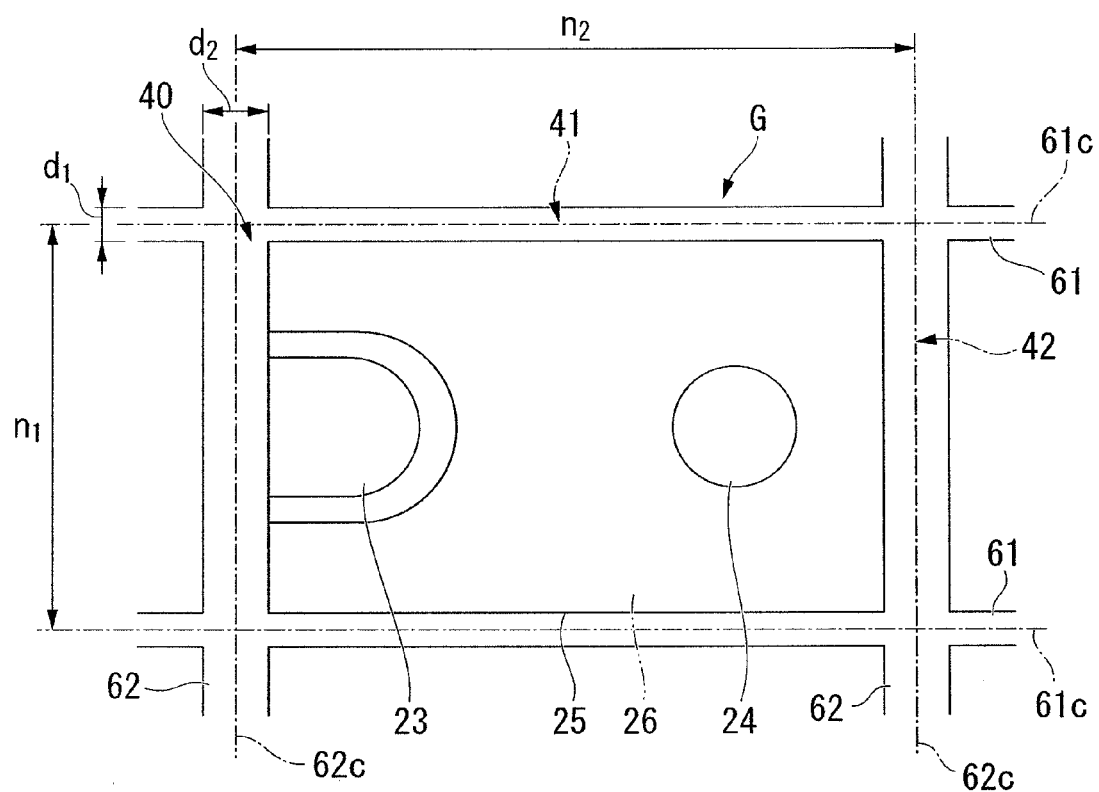
FIG. 6 is a diagram illustrating an example explaining one step of the method of manufacturing the semiconductor light-emitting device according to the invention, and a schematic enlarged view of the G portion in FIG. 4B.

FIGS. 4A to 6 are diagrams explaining one step of the method of manufacturing the semiconductor light-emitting device which is an embodiment of the invention. FIG. 4A is a plan view illustrating the wafer, and FIG. 4B is an enlarged plan view illustrating a portion of the wafer shown in FIG. 4A. FIG. 5A is a cross-sectional view taken along the E-E' line of FIG. 4B, and FIG. 5B is a cross-sectional view taken along the F-F' line of FIG. 4B. FIG. 6 is a schematic enlarged view of the G portion in FIG. 4B.

Meanwhile, in FIG. 4A, in the light-emitting device section 40, the first dividing groove 61 and the second dividing groove 62 are omitted for ease of viewing in the drawing, and in FIGS. 4A and 4B, a protective film 26 is omitted.

After the first dividing groove and the second dividing groove are formed, the protective film 26 is formed on the surface of the light-emitting device section 40 side of a wafer 30. The protective film 26 is a film capable of being removed after altered portions 13 are formed, and is a film for removing the contamination after the altered portions 13 are formed, to prevent the wafer 30 from being contaminated.

As the protective film 26, films, such as a resist, a transparent resin, a glass, a metal film and an insulating film, made of materials capable of being removed after the altered portions 13 are formed can be used without any limitation. The transparent resin includes an acrylic resin, polyester, polyimide, vinyl chloride, a silicon resin and the like. The metal film includes nickel and titanium, and the insulating film includes silicon oxide, silicon nitride and the like.

These protective films 26 can be formed by well-known means such as a coating method, an evaporation method and a sputtering method.

The thickness of the protective film 26 is preferably set to a range of 0.01 μm to 5 μm, and is more preferably set to a range of 0.01 μm to 1 μm. When the thickness of the protective film 26 is less than 0.01 μm, there may be a concern that the light-emitting device section 40 cannot be sufficiently protected due to damage of the protective film 26 at the time of forming the altered portions 13. In addition, when the thickness of the protective film 26 exceeds 5 μm, there may be a concern that during formation of the altered portions 13 using a laser, the protective film 26 may absorb the laser, and thus be peeled off.

Next, as shown in FIGS. 4A and 4B, laser irradiation is performed from the front (top face) and the rear of the substrate 10 so as to be along the central line 61c of the first dividing groove 61 and the central line 62c of the second dividing groove 62, and the altered portions 13 are formed in the substrate 10 so as to be along the central line 61c of the first dividing groove 61 and the central line 62c of the second dividing groove 62. The altered portions 13 shown in FIGS. 5A and 5B are regions of the portions in which materials of the substrate 10 are changed so that the substrate 10 is easily divided by laser irradiation.

As the widths of the regions of the altered portions 13 formed by laser irradiation, the width of the region of the altered portion 13 formed to be along the central line 61c of the first dividing groove 61 and the width of the region of the altered portion 13 formed to be along the central line 62c of the second dividing groove 62 may be different from each other, and the width of the region of the altered portion 13 formed to be along the central line 62c of the second dividing groove 62 is preferably larger than the width of the region of the altered portion 13 formed to be along the central line 61c of the first dividing groove 61.

FIG. 5A is a simple schematic diagram, and the altered portions 13 are set to a range limited to ○ marks and the vicinity thereof in FIG. 5A.

At the time of laser irradiation, a laser optical system such as the beam diameter and the focal position is controlled, the focal position of the laser is adjusted, and the position, the depth and the width of the altered portion 13 is controlled to a desired position, a depth and a width. Meanwhile, the focal point is preferably adapted to the vicinity of the epitaxial layer 37, particularly the surface of the epitaxial layer 37.

A laser beam machine capable of being used in laser scribing includes a $CO_2$ laser, a YAG laser, an excimer laser, a pulsed laser and the like. Above all, the pulsed laser is preferably used. The laser scribing has no variations in processing accuracy, and has a low cost.

As the wavelength of the laser, 1064 nm, 532 nm, 355 nm, 266 nm and the like can be used, and the shorter wavelength may be used. The frequency thereof is preferably 1 to 100,000 Hz, and more preferably 30,000 to 70,000 Hz. Though the output thereof is different depending on the width and the depth of the altered portion 13, it is preferably a minimum output necessary to obtain the desired altered portion 13.

Since the extra laser output causes thermal damage to the substrate 10 or the light-emitting device section 40, generally it is preferably equal to or less than 2 W, and is more preferably equal to or less than 1 W.

As shown in FIGS. 5A and 5B, the altered portion 13 is formed at the region of the light-emitting device section 40 side from the thickness center of the substrate 10. Meanwhile, in the invention, the altered portion 13 is not limited to the formation at the region of the light-emitting device section 40 side from the thickness center of the substrate 10, and may be formed at the region of the back side of the substrate 10 from the thickness center of the substrate 10. In addition, the altered portion 13 may be formed at not only one spot but also a number of spots in the thickness direction of the substrate 10.

When the total height of a plurality of altered portions 13 formed in the thickness direction of one side of the substrate 10 is set to h1 and the thickness of the substrate is set to h, the ratio h1/h is preferably 0.1 to 0.7, more preferably 0.15 to 0.6, and particularly preferably 0.2 to 0.5. When the ratio h1/h is equal to or more than 0.15, the shape of the compound semiconductor device obtained after the division can be controlled with good accuracy. When the ratio h1/h is less than 0.1, at the time of dividing the wafer 30 for each light-emitting device section 40, the section thereof becomes inclined, and thus the shape of the semiconductor light-emitting device obtained after the division is caused to become irregular.

Next, as shown in FIG. 4B and FIG. 6, the central lines 61c of a plurality of first dividing grooves 61 arranged parallel to the a-axis direction, and the central lines 62c of a plurality of second dividing grooves 62 arranged parallel to the m-axis direction are provided so as to intersect each other.

As shown in FIG. 4B, device regions 15 having an approximately rectangular shape in a plan view are partitioned in a matrix shape by the altered portions 13 formed to be along the central lines 61c and the central lines 62c. The light-emitting device sections 40 having an approximately rectangular shape in a plan view are included in the device regions 15. The light-emitting device sections 40 are provided at intervals of $n_2$ in the a-axis direction, and at intervals of $n_1$ in the m-axis direction.

After the altered portion 13 is formed, the protective film 26 is removed together with the contamination attached to the wafer 30.

Next, the plane on the side opposite to one plane 10a of the substrate 10 included in the wafer 30 is polished to thereby reduce the thickness of the substrate 10, and then the plane is polished to a mirror plane.

The thickness of the substrate 10 is set to 40 μm to 250 μm, preferably 50 μm to 150 μm, and more preferably 60 μm to 90 μm. The wafer 30 is easily divided by setting the above-mentioned range to the thickness of the substrate 10, thereby allowing the wafer 30 to be finely divided with a good efficiency.

Meanwhile, when the thickness of the substrate 10 exceeds 250 μm, it is difficult to divide the very rigid substrate 10 made of sapphire and the like with good accuracy. In addition, when the thickness of the substrate 10 is less than 80 μm, warpage caused by the difference of a lattice constant or a coefficient of thermal expansion between the substrate 10 and the epitaxial layer 37 becomes remarkable, and it is difficult to divide the substrate 10 with good accuracy.

Meanwhile, the above-mentioned polishing is performed in advance, and then the altered portion 13 may be formed at the substrate 10 side of the wafer 30. In addition, the altered portion 13 may be formed at both the side at which the light-emitting device section 40 is formed and the substrate 10 side.

Figure 7:
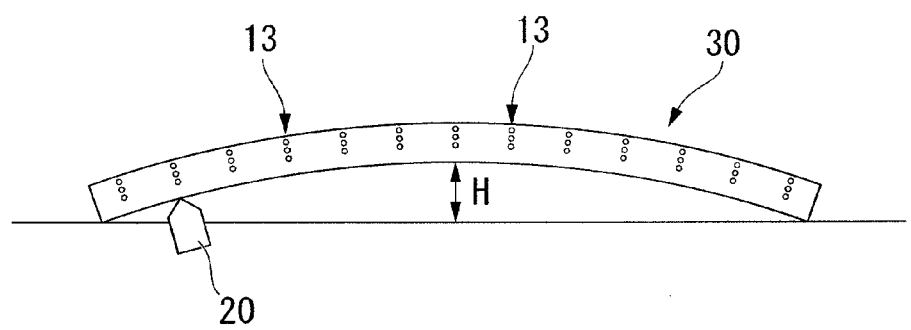
FIG. 7 is a diagram illustrating an example explaining one step of the method of manufacturing the semiconductor light-emitting device according to the invention, and a cross-sectional view in the m-axis direction of the wafer at the point in time of the division.
Figure 8:
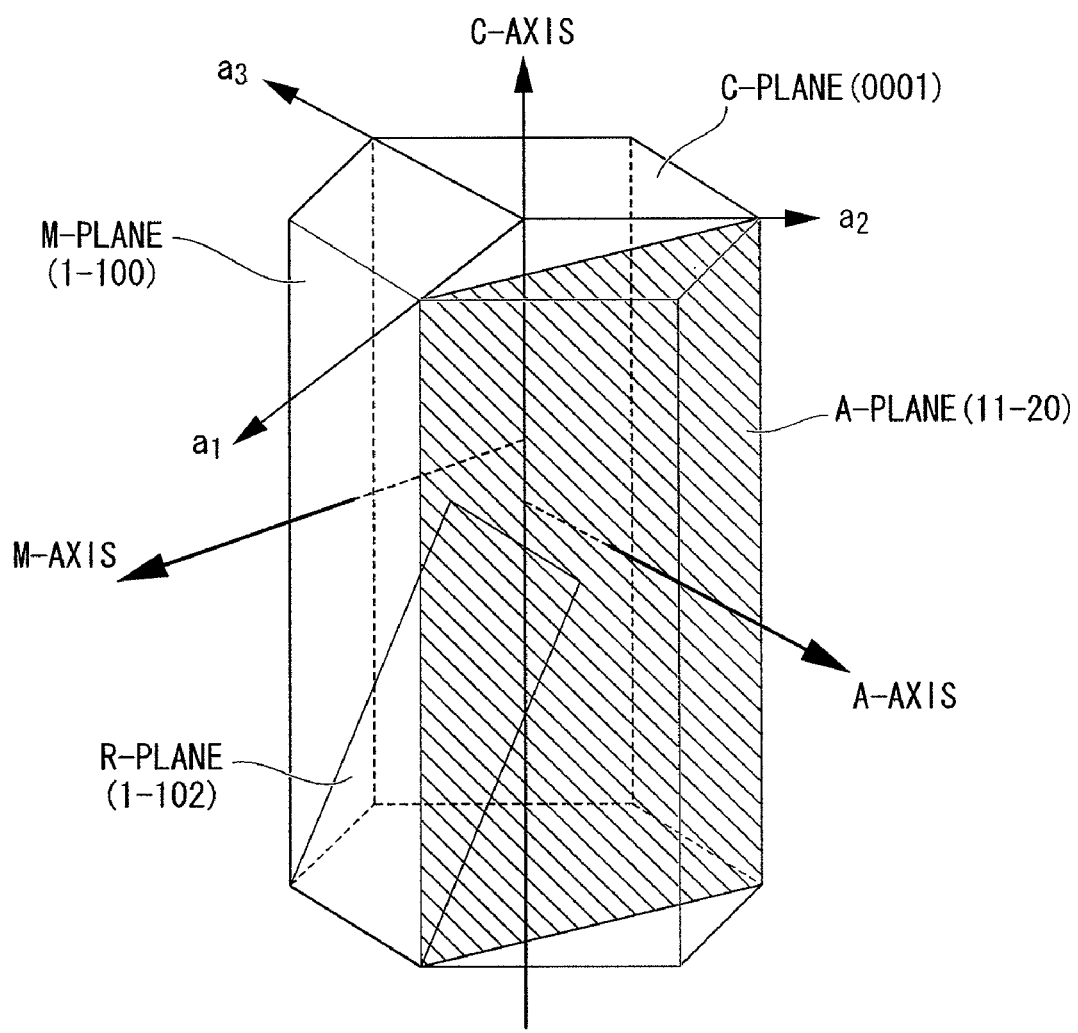
FIG. 8 is a diagram illustrating a unit cell of sapphire.

FIG. 7 is a diagram explaining one step of the method of manufacturing the semiconductor light-emitting device which is an embodiment of the invention, and is a cross-sectional view in the m-axis direction of the wafer 30 at the point in time of the division thereof.

After the thickness of the substrate 10 is reduced, a sheet is attached to the surface of the wafer 30 facing the light-emitting device section 40 side so that the semiconductor light-emitting devices obtained after the division thereof are not torn apart.

Next, as shown in FIG. 7, by using a camera and the like, an edge of a cleaving blade 20 is aligned with a position opposite to the first dividing groove 61, and is brought into contact along the first dividing groove 61 from the substrate 10 side of the wafer 30.

Meanwhile, the altered portion 13 is provided by forming the light-emitting device section 40, and in the wafer 30 of which the substrate 10 is set to a predetermined thickness by polishing, the one having an outside diameter of two inches or more is warped as shown by symbol H in FIG. 6.

As the cleaving blade 20, for example, one is used which is made of Zr and has a linear edge formed so that one side of the lateral sides of a square pillar is upthrusted in a mountain shape.

Next, the edge of the cleaving blade 20 is slightly pressed into the wafer 30.

The depth to which the cleaving blade 20 is pressed into the wafer 30 is preferably set to 10 μm to 150 μm, and more preferably 10 μm to 40 μm.

When the depth to which the cleaving blade 20 is pressed into the wafer 30 is less than 10 μm, the wafer may not be divided. In addition, when the depth to which the cleaving blade 20 is pressed into the wafer 30 exceeds 150 μm, distortion occurs in the altered portion 13, whereby the arrangement of the divided devices may be deteriorated, or fissures may be generated in the devices. With this, even the sheet attached to the surface of the wafer 30 facing the light-emitting device section 40 side before the division step is cut, and thus the semiconductor light-emitting devices obtained after the division thereof may be torn apart.

Next, the cleaving blade 20 is pressed against the substrate 10, and the wafer 30 is divided by generating a crack from the altered portion 13 of the first dividing groove 61.

Thereby, the wafer 30 is divided along the first dividing groove 61 parallel to the a-axis direction, and is formed as a bar-shaped wafer.

Next, by using a camera and the like, the edge of the cleaving blade 20 is aligned with a position opposite to the second dividing groove 62, and is brought in contact along the second dividing groove 62 from the substrate 10 side of the wafer 30.

Similarly to the division of the first dividing groove 61, after the edge of the cleaving blade 20 is slightly pressed into the wafer 30, the cleaving blade 20 is pressed against the substrate 10, and the wafer 30 is divided by generating a crack from the altered portion 13 of the second dividing groove 62.

Thereby, the bar-shaped wafer is divided along the second dividing groove 62 parallel to the m-axis direction, and is formed as the semiconductor light-emitting device including the light-emitting device section 40 and having an approximately rectangular shape in a plan view. The semiconductor light-emitting device is a plurality of approximately rectangular shapes in a plan view of which the length of the long side 41 is $n_2$ and the length of the short side 42 is $n_1$. Here, the long side 41 is formed along the easily cleaved plane.

Meanwhile, the above-mentioned semiconductor light-emitting device may be formed by dividing the division step of the first dividing groove 61 and the division step of the second dividing groove 62 into multiple division steps.

The method of manufacturing the semiconductor light-emitting device which is an embodiment of the invention includes the steps of forming a plurality of light-emitting device sections 40, having an approximately rectangular shape in a plan view, on the substrate 10 in a matrix shape, forming the first dividing groove 61 between the long sides 41 of the light-emitting device sections 40 so that the long side 41 of the light-emitting device section 40 is along the easily cleaved plane of the substrate 10, forming the second dividing groove 62, having a larger width than the width of the first dividing groove 61, between the short sides 42 of the light-emitting device sections 40, and dividing the substrate 10 along the first dividing groove 61 and the second dividing groove 62 to cut out the light-emitting device section 40. Therefore, it is possible to easily cleave the substrate 10 by the first dividing groove 61 provided between the long sides 41 formed along the easily cleaved plane, and to prevent the occurrence of chipping. The substrate 10 is cleaved by the second dividing groove 62 which is provided between the short sides 42 of the light-emitting device sections 40 and has a larger width $d_2$ than the width $d_1$ of the first dividing groove 61. Therefore, even when chipping occurs, it is possible to restrain chipping from reaching the light-emitting device section 40 without exposing the epitaxial layer 37, and to prevent leakage in the light-emitting device section.

In the method of manufacturing the semiconductor light-emitting device which is an embodiment of the invention, since the substrate 10 is made of a sapphire, the first dividing groove 61 is formed along the easily cleaved plane of the sapphire to facilitate the division of the substrate 10, whereby it is possible to prevent the occurrence of chipping when divided from the sapphire substrate 10.

In the method of manufacturing the semiconductor light-emitting device which is an embodiment of the invention, since the first dividing groove 61 is formed so as to be parallel to the a-axis of the above-mentioned sapphire, it is possible to easily cleave the sapphire substrate 10 along the first dividing groove 61, and to prevent the occurrence of chipping when divided from the sapphire substrate 10.

In the method of manufacturing the semiconductor light-emitting device which is an embodiment of the invention, the width of the second dividing groove 62 is set to twice the width or greater of each of the first dividing grooves 61. Therefore, even when chipping occurs between the short sides 42 when divided from the sapphire substrate 10, it is possible to prevent leakage in each of the light-emitting device sections 40 without chipping reaching the light-emitting device section 40.

In the method of manufacturing the semiconductor light-emitting device which is an embodiment of the invention, since the first dividing groove 61 and the second dividing groove 62 are formed by one means selected from a group consisting of a laser method, a scribing method, a dicing method and a dry etching method, it is possible to easily divide the sapphire substrate 10, to prevent the occurrence of chipping when divided from the sapphire substrate 10, and to prevent leakage even when chipping occurs.

In the method of manufacturing the semiconductor light-emitting device which is an embodiment of the invention, since the substrate 10 has the altered portion 13 formed by laser irradiation from the front (top face) or the rear of the substrate 10 so as to be along the central line 61c of the first dividing groove 61 and the central line 62c of the second dividing groove 62, it is possible to easily divide the sapphire substrate 10, to prevent the occurrence of chipping when divided from the sapphire substrate 10, and to prevent leakage even when chipping occurs.

In the method of manufacturing the semiconductor light-emitting device which is an embodiment of the invention, since as the heights of the region of the altered portion 13 formed by the above-mentioned laser irradiation, the height of the region of the altered portion 13 formed to be along the central line 61c of the first dividing groove 61 and the height of the region of the altered portion 13 formed to be along the central line 62c of the second dividing groove 62 are different from each other, it is possible to easily divide the sapphire substrate 10, to prevent the occurrence of chipping when divided from the sapphire substrate 10, and to prevent leakage even when chipping occurs.

In the method of manufacturing the semiconductor light-emitting device which is an embodiment of the invention, since as the heights of the region of the altered portion 13 formed by the above-mentioned laser irradiation, the height of the region of the altered portion 13 formed to be along the central line 62c of the second dividing groove 62 is larger than the height of the region of the altered portion 13 formed to be along the central line 61c of the first dividing groove 61, it is possible to easily divide the sapphire substrate 10, to prevent the occurrence of chipping when divided from the sapphire substrate 10, and to prevent leakage even when chipping occurs.

EXAMPLE

Hereinafter, the invention will be described in detail on the basis of the following examples. However, the invention is not limited to these examples.

Example 1

As shown below, a group-III nitride semiconductor light-emitting device having a light-emitting device section which includes a gallium nitride-based compound semiconductor was fabricated.

First, an underlying layer, made of undoped GaN, having a thickness of 4 μm, an n contact layer, made of Si-doped (concentration of $1 \times 10^{19}/cm^3$) GaN, having a thickness of 2 μm, an n cladding layer, made of Si-doped (concentration of $1 \times 10^{18}/cm^3$) $In_{0.1}Ga_{0.9}N$, having a thickness of 12.5 nm, a barrier layer, made of GaN, having a thickness of 16 nm, and a well layer, made of $In_{0.2}Ga_{0.8}N$, having a thickness of 2.5 nm were alternately laminated five times on the main plane of a disk-shaped C-plane sapphire substrate having an outside diameter of 100 mm with a buffer layer made of AlN interposed therebetween, and then an epitaxial layer, made of a group-III nitride semiconductor, having a thickness of 9 μm were finally formed in which a light-emitting layer, having a multiple quantum well structure, provided with a barrier layer, a p cladding layer, made of Mg-doped (concentration of $1 \times 10^{20}/cm^3$) $Al_{0.07}Ga_{0.93}N$, having a thickness of 2.5 nm, and a p contact layer, made of Mg-doped (concentration of $8 \times 10^{19}/cm^3$) GaN, having a thickness of 0.15 μm were sequentially laminated. Meanwhile, an orientation flat portion which is parallel to the m-axis direction and perpendicular to the a-axis direction was formed on the above-mentioned sapphire substrate.

Next, a light-transmitting positive electrode having a structure in which Au and NiO were laminated in order from the p contact layer side was formed at a predetermined position on the p contact layer of the epitaxial layer, using a photolithographic technique and a liftoff technique which are known. The transmittance of the light-transmitting positive electrode in light having a wavelength of 470 nm was 60%.

Next, a positive-electrode bonding pad having a layer structure made of Ti/Al/Ti/Au from the semiconductor side was formed using the known photolithographic technique.

Next, as shown in FIGS. 4A and 4B, by etching the epitaxial layer included in the substrate on which even the positive-electrode bonding pad was formed using the known photolithographic technique and a reactive ion etching technique, the first dividing groove having a pitch $n_1$ of 180 μm and a width (dividing groove width of the short side) $d_1$ of 20 μm was formed along the m-axis direction (the short side of the light-emitting device in the example of FIG. 4B of the specification), and the second dividing groove having a pitch $n_2$ of 400 μm and a width $d_2$ of 40 μm was formed along the a-axis direction. In addition, simultaneously, the n contact layer was exposed to a predetermined position facing the second dividing groove in a semicircular shape.

Next, a negative-electrode bonding pad having a two-layer structure made of Ti/Au was formed in the exposed n contact layer by the well-known method.

A wafer for a light-emitting device having a plurality of light-emitting device sections separated by the first dividing groove and the second dividing groove was formed through the above-mentioned steps.

Next, a water-soluble resist was uniformly applied to the whole surface of the light-emitting device section side of the wafer by a spin coater and was dried, to form a protective film having a thickness of 0.2 μm thereon. Next, UV tape was attached to the substrate side of the wafer, and the UV tape was detached without cleaning the resist.

Next, the wafer was fixed onto a stage of a pulsed laser beam machine by a vacuum chuck. The stage having a structure capable of being moved in the X-axis (horizontal) and the Y-axis (longitudinal) directions and capable of being rotated was used.

Next, a laser optical system was adjusted so that the focal point of a laser was gathered on the surface of the epitaxial layer of the first dividing groove, and an altered portion of a region (height of the region of 20 μm) having a width of 5 μm in the direction (a-axis direction) perpendicular to the orientation flat plane of the sapphire substrate, and a depth of 20 μm from the surface of the substrate was formed in the bottom of the first dividing groove. The conditions of laser irradiation were set to a laser wavelength of 266 nm, a frequency of 50 kHz, an output of 1.6 W, and a processing speed of 70 mm/second.

Next, the stage was rotated 90°, and then the same altered portion was formed in the bottom of the second dividing groove in the m-axis direction perpendicular to the a-axis direction. After the altered portion was formed, the vacuum chuck was released, and the wafer was detached from the stage.

Next, the wafer was placed on a stage of a washer, and the protective film formed before the altered portion was formed was removed by letting shower water flow into the surface of the light-emitting device section side while rotating the wafer. Thereafter, the shower water was blown off by rotation at a high rotation speed and the surface thereof was dried.

Next, by lapping and polishing the sapphire substrate side of the wafer, the thickness of the sapphire substrate was reduced so that the total thickness obtained by adding the thickness of the epitaxial layer to the thickness of the substrate was set to 80 μm. Ra of the rear surface of the substrate (surface on which the light-emitting device section is not formed) was set to 0.005 μm. The contamination was not observed at all on the obtained surface of the wafer in visual inspection.

Next, the wafer was divided along the first dividing groove in increasing order of length of the first dividing groove in the wafer, and thus a first bar-shaped wafer in which the light-emitting device sections were arranged in two rows in the a-axis direction was obtained.

The division of the wafer was performed by bringing a cleaving blade made of Zr into contact along the first dividing groove from the substrate side of the wafer, pressing the cleaving blade against the substrate to press it into the wafer at a depth of 40 μm, and generating a crack from the altered portion of the first dividing groove.

Next, the cleaving blade was brought into contact along the second dividing groove from the substrate side of the bar-shaped wafer, the cleaving blade was pressed against the substrate to press it into the wafer at a depth of 40 μm, and a crack was generated from the altered portion of the second dividing groove. Thereby, the bar-shaped wafer was divided along the second dividing groove, and thus a second bar-shaped wafer in which the light-emitting device sections were arranged in a row in the m-axis direction was obtained.

Next, the cleaving blade was brought into contact along the first dividing groove from the substrate side of the second bar-shaped wafer, the cleaving blade was pressed against the substrate to press it into the wafer at a depth of 40 μm, and a crack was generated from the altered portion of the first dividing groove. Thereby, the second bar-shaped wafer was divided along the first dividing groove, and thus a plurality of group-III nitride semiconductor light-emitting devices (LED chips), having an approximately rectangular shape in a plan view, of which the length of the long side was 400 μm and the length of the short side was 240 μm was obtained.

Meanwhile, the arrangement of the LED chips of which the long side is parallel to the a-axis direction is referred to as a vertical type, and the arrangement of the LED chips of which the long side is perpendicular to the a-axis direction is referred to as a horizontal type.

The LED characteristics of the LED chip obtained in Example 1 had an emission wavelength of 451 nm and an emission output of 16.9 mW when the voltage Vf was 3.18 V.

Example 2, and Comparative Examples 1 and 2

The semiconductor light-emitting devices according to Example 2, and Comparative Examples 1 and 2 were manufactured as described in Example 1 except that the sizes of the long side and the short side of the semiconductor light-emitting device, the arrangement of the semiconductor light-emitting device in the sapphire substrate, and the dividing groove widths were changed. The manufacturing conditions of each of the semiconductor light-emitting devices, the defect rate and the LED characteristics are shown together in Table 1.

The cracking defect rate of the semiconductor light-emitting devices according to Comparative Examples 1 and 2 were 13 to 16%, while the cracking defect rate of the semiconductor light-emitting devices according Examples 1 and 2 could be improved to 2 to 4%. Here, the cracking defect rate means the incidence of the defects due to cracking or chipping in light of the criteria for acceptance determination relating to the predetermined sizes of the long side and the short side, and means a value obtained by dividing the number of the defects by the number of the semiconductor light-emitting devices designed on one sapphire substrate. Meanwhile, the semiconductor light-emitting device, having an incomplete device shape, which is designed and arranged in the vicinity of the section of one sapphire substrate is excluded from the subject for acceptance determination.

Examples 3 and 4

In the semiconductor light-emitting device according to Example 3, the sizes of the long side and the short side thereof, the arrangement of the semiconductor light-emitting device in the sapphire substrate, and the dividing groove widths were set to be the same as those of Example 1 except that the thickness of the sapphire substrate was reduced so that the total thickness of the semiconductor light-emitting device became 140 μm. In addition, in the semiconductor light-emitting device according to Example 4, the sizes of the long side and the short side of the semiconductor light-emitting device, the arrangement of the semiconductor light-emitting device in the sapphire substrate, and the dividing groove widths were set to be the same as those of Example 2 except that the thickness of the sapphire substrate was reduced so that the total thickness thereof became 140 μm.

Meanwhile, in each of the substrates used in Example 3 and Example 4, a substrate was used in which the center of the altered portion was formed by a predetermined laser (wavelength of 532 nm) to a depth of 40 μm and 120 μm from the front (main plane of the substrate) side where the light-emitting device section was formed. On this occasion, the height of the region of the altered portion was set so that the first dividing groove was 20 μm in height and the second dividing groove was 30 μm in height.

The cracking defect rate of the semiconductor light-emitting devices according to Examples 3 and 4 could be improved to 0%.

TABLE 1

| | Manufacturing conditions | | | | LED characteristics | | |
|---|---|---|---|---|---|---|---|
| Sample | LED chip size Long side × short side (μm) | Arrangement of light-emitting device at the time of putting down orientation flat portion of sapphire substrate | Division groove width at the short side (μm) | Cracking defect rate | Vf (V) | λd (nm) | Po20 (mW) |
| Example 1 | 400 × 180 | Vertical | 20 | 4% | 3.18 | 451 | 16.9 |
| Example 2 | 400 × 240 | Vertical | 20 | 2% | 3.05 | 454 | 17.6 |
| Example 3 | 400 × 180 | Vertical | 20 | 0% | 3.17 | 451 | 17 |
| Example 4 | 400 × 240 | Vertical | 20 | 0% | 3.07 | 454 | 17.8 |
| Comparative Example 1 | 400 × 180 | Horizontal | 10 | 16% | 3.19 | 450 | 17 |

TABLE 1-continued

| | Manufacturing conditions | | | | | | |
|---|---|---|---|---|---|---|---|
| Sample | LED chip size Long side × short side (μm) | Arrangement of light-emitting device at the time of putting down orientation flat portion of sapphire substrate | Division groove width at the short side (μm) | Cracking defect rate | LED characteristics | | |
| | | | | | Vf (V) | λd (nm) | Po20 (mW) |
| Comparative Example 2 | 400 × 240 | Horizontal | 10 | 13% | 3.06 | 454 | 17.9 |

As mentioned above, although the preferred embodiments of the invention have been described herein, the invention is not limited to these embodiments. Additions, omissions, substitutions of the configuration, and other modifications thereof can be made without departing from the spirit or scope of the invention. The invention is not limited by the foregoing description, but is only limited by the scope of the appended claims.

The invention relates to a method of manufacturing a semiconductor light-emitting device, specifically to a method of manufacturing a semiconductor light-emitting device capable of preventing the occurrence of chipping when divided from a sapphire substrate, prevent leakage even when chipping occurs, and improving the manufacturing efficiency of the semiconductor light-emitting device, and can be industrially applied for manufacturing and using an L semiconductor light-emitting device.

What is claimed is:

1. A method of manufacturing a semiconductor light-emitting device, comprising the steps of:
    forming a plurality of light-emitting device sections, having an approximately rectangular shape in plan view, on a substrate in a matrix shape;
    forming a first dividing groove between the long sides of the light-emitting device sections so that the long side of the light-emitting device section is along an easily cleaved plane of the substrate;
    forming a second dividing groove, having a larger width than the width of the first dividing groove, between the short sides of the light-emitting device sections; and
    dividing the substrate along the first dividing groove and the second dividing groove to cut out the light-emitting device section.

2. The method of manufacturing a semiconductor light-emitting device according to claim 1, wherein the substrate is made of sapphire.

3. The method of manufacturing a semiconductor light-emitting device according to claim 1, wherein the first dividing groove is formed so as to be parallel to the a-axis of the sapphire.

4. The method of manufacturing a semiconductor light-emitting device according to claim 1, wherein the width of the second dividing groove is set to at least twice the width of the first dividing groove.

5. The method of manufacturing a semiconductor light-emitting device according to claim 1, wherein the first dividing groove and the second dividing groove are formed by one means selected from the group consisting of a laser method, a scribing method, a dicing method, and a dry etching method.

6. The method of manufacturing a semiconductor light-emitting device according to claim 1, wherein the substrate has an altered portion formed by laser irradiation from the front (top face) or the rear of the substrate so as to be along the central line of the first dividing groove and the central line of the second dividing groove.

7. The method of manufacturing a semiconductor light-emitting device according to claim 6, wherein as to the height of the altered portion formed by the laser irradiation, the height of the altered portion formed along the central line of the first dividing groove and the height of the region of the altered portion formed along the central line of the second dividing groove are different from each other.

8. The method of manufacturing a semiconductor light-emitting device according to claim 6, wherein as to the height of the altered portion formed by laser irradiation, the height of the altered portion formed along the central line of the second dividing groove is larger than the height of the altered portion formed along the central line of the first dividing groove.

* * * * *